(12) United States Patent
Cheng et al.

(10) Patent No.: US 10,847,634 B2
(45) Date of Patent: Nov. 24, 2020

(54) FIELD EFFECT TRANSISTOR AND METHOD OF FORMING THE SAME

(71) Applicant: Taiwan Semiconductor Manufacturing Co., Ltd., Hsinchu (TW)

(72) Inventors: Te-En Cheng, Taoyuan (TW); Chun-Te Li, Kaohsiung (TW); Kai-Hsuan Lee, Hsinchu (TW); Tien-I Bao, Taoyuan (TW); Wei-Ken Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/884,395

(22) Filed: Jan. 31, 2018

(65) Prior Publication Data

US 2019/0131436 A1 May 2, 2019

Related U.S. Application Data

(60) Provisional application No. 62/578,532, filed on Oct. 30, 2017.

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 29/66* | (2006.01) | |
| *H01L 29/49* | (2006.01) | |

(Continued)

(52) U.S. Cl.
CPC .. *H01L 29/66795* (2013.01); *H01L 21/28088* (2013.01); *H01L 21/32053* (2013.01); *H01L 21/32133* (2013.01); *H01L 21/823431* (2013.01); *H01L 21/845* (2013.01); *H01L 27/0886* (2013.01); *H01L 27/0924* (2013.01); *H01L 27/1211* (2013.01); *H01L 29/4916* (2013.01); *H01L 29/66545* (2013.01); *H01L 29/7845* (2013.01); *H01L 29/7851* (2013.01); *H01L 21/0228* (2013.01); *H01L 21/02126* (2013.01); *H01L 21/02211* (2013.01); *H01L 29/165* (2013.01); *H01L 29/7848* (2013.01)

(58) Field of Classification Search
CPC ....... H01L 29/66719; H01L 21/823814; H01L 29/66545; H01L 29/66795; H01L 29/785; H01L 21/823425; H01L 21/823456; H01L 21/8238; H01L 21/823828; H01L 21/82385; H01L 21/823878; H01L 21/28035; H01L 21/32133; H01L 21/8258; H01L 21/84; H01L 29/66689; H01L 29/66787; H01L 29/78624
USPC ....................................................... 257/329
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Theresa T Doan
(74) *Attorney, Agent, or Firm* — JCIPRNET

(57) ABSTRACT

Field effect transistor and methods of forming the same are disclosed. The field effect transistor includes a gate electrode, a contact etch stop layer (CESL), an inter layer dielectric (ILD) and a protection layer. The CESL includes SiCON and is disposed on a sidewall of the gate electrode. The IDL is laterally adjacent to the gate electrode. The protection layer covers the CESL and is disposed between the CESL and the ILD.

20 Claims, 4 Drawing Sheets

(51) Int. Cl.

| | | |
|---|---|---|
| *H01L 29/78* | (2006.01) | |
| *H01L 27/092* | (2006.01) | |
| *H01L 21/8234* | (2006.01) | |
| *H01L 27/088* | (2006.01) | |
| *H01L 21/84* | (2006.01) | |
| *H01L 21/28* | (2006.01) | |
| *H01L 21/3205* | (2006.01) | |
| *H01L 21/3213* | (2006.01) | |
| *H01L 27/12* | (2006.01) | |
| H01L 29/165 | (2006.01) | |
| H01L 21/02 | (2006.01) | |

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2013/0043539 A1* | 2/2013 | Chang et al. |
| 2013/0043590 A1* | 2/2013 | Lin .................... H01L 21/76802 257/741 |
| 2015/0357329 A1* | 12/2015 | Lim ..................... H01L 27/092 257/369 |
| 2016/0260613 A1* | 9/2016 | Chen et al. |
| 2016/0315008 A1* | 10/2016 | Tung ................. H01L 21/82343 |
| 2017/0133479 A1* | 5/2017 | Wang .................. H01L 21/0332 |
| 2017/0194212 A1* | 7/2017 | Hung et al. |

* cited by examiner

# FIELD EFFECT TRANSISTOR AND METHOD OF FORMING THE SAME

CROSS-REFERENCE TO RELATED APPLICATION

This application claims the priority benefit of U.S. provisional application Ser. No. 62/578,532, filed on Oct. 30, 2017. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. Although existing field-effect transistors and methods of forming field-effect transistors have been generally adequate for their intended purposes, they have not been entirely satisfactory in all respects.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
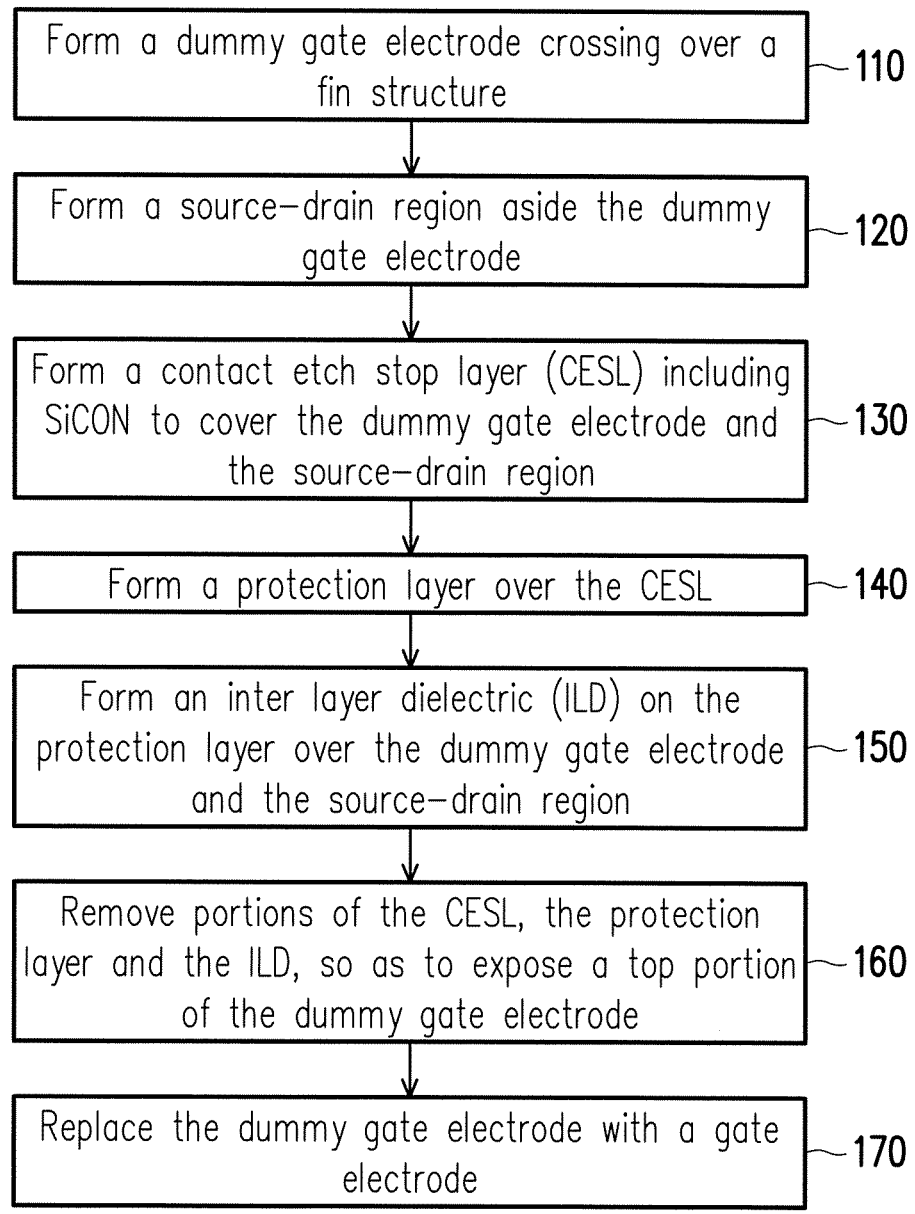
FIG. 1 illustrates a flow chart illustrating a method for fabricating a field effect transistor in accordance with some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2:
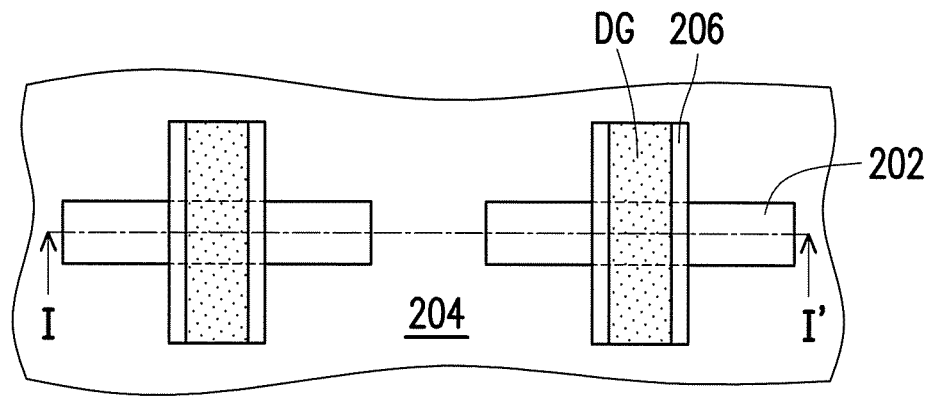
FIG. 2 is a simplified top view of a fin structure and a dummy gate in accordance with some embodiments of the present disclosure.

FIG. 1 illustrates a flow chart illustrating a method for fabricating a field effect transistor in accordance with some embodiments of the present disclosure. FIG. 2 is a simplified top view of a fin structure 202 and a dummy gate electrode DG in accordance with some embodiments of the present disclosure. FIGS. 3A to 3E are cross-sectional views at various stages of forming a semiconductor structure taken along a section line I-I' of FIG. 2 in accordance with some embodiments of the present disclosure. In some embodiments, the term field effect transistor refers to a fin field effect transistor (FinFET). The FinFET refers to any fin-based, multi-gate transistor. In alternative some embodiments, the term field effect transistor refers to a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC).

In addition, the field effect transistor of FIG. 1 may be further processed using CMOS technology processing. Accordingly, it is understood that additional processes may be provided before, during, and after the method of FIG. 1, and that some other processes may only be briefly described herein. Also, FIGS. 1 to 3E are simplified for a better understanding of the concepts of the present disclosure. For example, although the figures illustrate the contact etch stop layers of a field effect transistor, it is understood the field effect transistor may be part of an IC that further includes a number of other devices such as resistors, capacitors, inductors, fuses, etc.

Figure 3A:
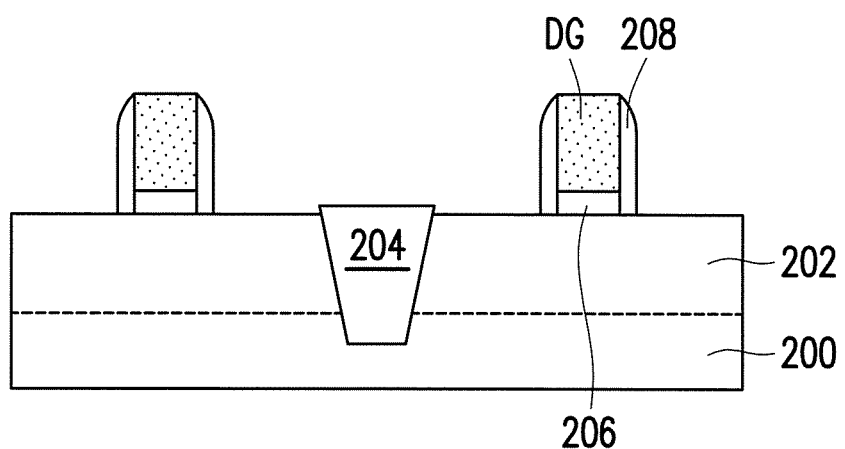
FIGS. 3A to 3E are cross-sectional views at various stages of forming a field effect transistor taken along a section line I-I' of FIG. 2 in accordance with some embodiments of the present disclosure.

Referring to FIGS. 1, 2 and 3A, at step 110, the dummy gate electrode DG is formed crossing over the fin structure 202. In some embodiments, a substrate 200 is provided. In some embodiments, the substrate 200 includes a crystalline silicon substrate (e.g., wafer). The substrate may include various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In alternative some embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, as shown in FIG. 3A, the fin structure 202 is formed by selectively etching the substrate 200. In some embodiments, portions of the substrate 200 are removed to define the fin structure 202 protruding from the substrate 200. In some embodiments, the substrate 200 and the fin structure 202 are integrally formed; that is, there is no boundary between the substrate 200 and the fin structure 202. However, other techniques for fabricating the fin structure 202 are possible. In some embodiments, the substrate 200 and the fin structure 202 are made of a same material.

In some embodiments, as shown in FIGS. 2 and 3A, an isolation structure 204 is formed between the fin structures 202, such as a local oxidation of silicon (LOCOS) or a shallow trench isolation (STI) structure. The isolation structure 204 is configured to isolate the two fin structures 202. The isolation structure 204 may be formed by filling a trench between the fin structures 202 with a dielectric material. In some embodiments, the dielectric material may include silicon oxide, silicon nitride, silicon oxynitride, fluoride-doped silicate glass (FSG), a spin-on dielectric material, a low-k dielectric material, any other suitable dielectric material or a combination thereof. The dielectric material may be formed by high-density-plasma chemical vapor deposition (HDP-CVD), sub-atmospheric CVD (SACVD) or by spin-on. In some embodiments, the isolation structure 204 may have a multi-layer structure such as a thermal oxide liner layer filled with silicon nitride or silicon oxide.

In some embodiments, the fin structure 202 is an active region. In some alternative embodiments, the active regions may be formed in the substrate 200 and include various doping configurations depending on design requirements as known in the art. In some alternative embodiments, the active region may be doped with p-type or n-type dopants. For example, the active regions may be doped with p-type dopants, such as boron or BF2; n-type dopants, such as phosphorus or arsenic; and/or combinations thereof. The active regions may be configured for an N-type metal-oxide-semiconductor field effect transistor (referred to as an NMOSFET), or alternatively configured for a P-type metal-oxide-semiconductor field effect transistor (referred to as a PMOSFET).

A gate dielectric layer 206 and the dummy gate electrode DG are then formed crossing over the fin structure 202, as shown in FIGS. 2 and 3A. The dummy gate electrode DG will be removed later to form a cavity, and a conductive material will then be formed in the cavity to form a real gate. In some embodiments, the gate dielectric layer 206 and the dummy gate electrode DG are formed by forming a gate dielectric material (not shown) and a dummy gate electrode material (not shown) over the fin structure 202 sequentially, and then performing a patterning process on the dummy gate electrode material and the gate dielectric material. In some embodiments, the gate dielectric material may include silicon oxide, silicon nitride, silicon oxynitride, high-k dielectrics, any other suitable dielectric material or a combination thereof. High-k dielectrics include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric material may be formed using a suitable process such as atomic layer deposition (ALD), chemical vapor deposition (CVD), physical vapor deposition (PVD), thermal oxidation process, UV-ozone oxidation, or combinations thereof. The gate dielectric layer 206 may have any suitable thickness. In some embodiments, the gate dielectric layer 206 is a high-k dielectric with a thickness in the range of about 10 angstroms to 30 angstroms. In some embodiments, the gate dielectric layer 206 may further include an interfacial layer (not shown) to minimize stress between the gate dielectric layer 206 and the fin structure 202. The interfacial layer may be formed of silicon oxide or silicon oxynitride grown by a thermal oxidation process. For example, the interfacial layer can be grown by a rapid thermal oxidation (RTO) process or in an annealing process including oxygen.

In some embodiments, the dummy gate electrode material may be formed over the gate dielectric material. The dummy gate electrode material may include a single layer or multilayer structure. In some embodiments, the dummy gate electrode material may include a silicon-containing material, such as poly-silicon, amorphous silicon, or metal, such as Al, Cu, W, Ti, Ta, TiN, TiAl, TiAlN, TaN, NiSi, CoSi, other conductive materials with a work function compatible with the substrate material, or combinations thereof. The dummy gate electrode material may be formed over the gate dielectric material by deposition, such as ALD, CVD, PVD, LPCVD (low-pressure CVD), plating, or combinations thereof. In some embodiments, the patterning process, such as photolithography and etching processes, is performed on the dummy gate electrode material and the gate dielectric material therebeneath to form the dummy gate electrode DG and the gate dielectric layer 206 crossing over the fin structure 202. The dummy gate electrode DG may have any suitable thickness. In some embodiments, the dummy gate electrode DG has a thickness in the range of about 30 nm to about 60 nm.

In alternative some embodiments, a hard mask layer (not shown) may be formed over the dummy gate electrode DG to protect the dummy gate electrode DG. The hard mask layer may include silicon nitride. The hard mask layer can be deposited by, for example, a CVD process, or a LPCVD process. The hard mask layer may have a thickness of about 100 angstroms to 400 angstroms. In alternative some embodiments, after the hard mask layer is deposited, the hard mask layer is patterned using a photo-sensitive layer. Then, the dummy gate electrode material and the gate dielectric material are patterned through the hard mask layer using a reactive ion etching (RIE) or a high density plasma (HDP) process, exposing a portion of the fin structure, thereby forming a gate structure including the hard mask layer, the dummy gate electrode and the gate dielectric layer.

Still referring to FIGS. 2 and 3A, a spacer 208 is formed laterally adjacent to the dummy gate electrode DG. In some embodiments, a dielectric material (not shown) is deposited covering the dummy gate electrode DG and then anisotropically etched to form the spacer 208 over a sidewall of the dummy gate electrode DG. In some embodiments, the spacer 208 is formed of dielectric materials, such as silicon oxide, silicon nitride, silicon oxynitride, silicon carbon nitride, fluoride-doped silicate glass (FSG), a low k dielectric material, any other suitable dielectric material or a combination thereof. The spacer 208 may include a single layer or multilayer structure. A width of the spacer 208 on one side of the dummy gate electrode DG may be in the range of about 6 nm to 35 nm. In alternative some embodiments, at least one spacer may be further disposed on a sidewall of the spacer 208.

Figure 3B:
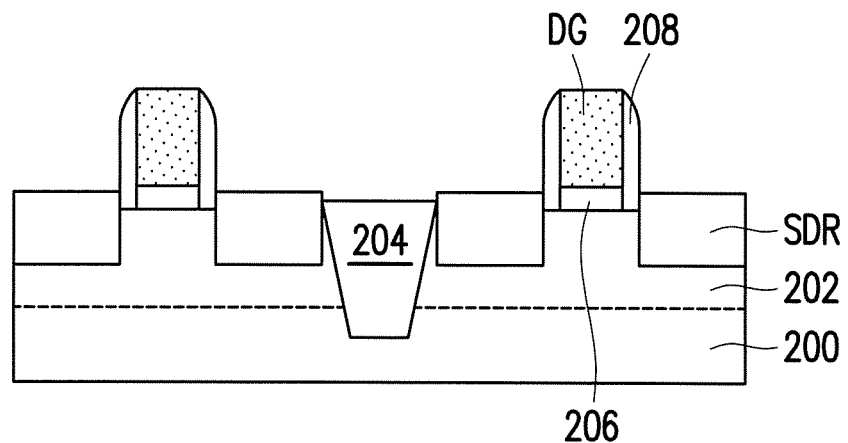

Referring to FIGS. 1 and 3B, at step 120, a source-drain region SDR is formed aside the dummy gate electrode DG. In some embodiments, after the spacer 208 is formed, portions of the fin structure 202 are removed to form recesses, and the source-drain region SDR is then formed in the recesses. In some embodiments, the portions of the fin structure 202 are removed using photolithography and etching processes, which may include: forming a photoresist layer, patterning the photoresist layer to expose the portions of the fin structure 202 and etching the portions of the fin structure 202 according to the photoresist layer. In some embodiments, the source-drain region SDR may be respectively epitaxially (epi) grown in the recesses. In some embodiments, the source-drain region SDR is epitaxially grown protruding from the recesses and has an upper surface higher than an upper surface of the fin structure 202. In some embodiments, the sources and drain SDR, such as silicon germanium (SiGe), is epitaxial-grown by a LPCVD process to form the source and drain of the p-type FinFET (or the PMOSFET). In alternative some embodiments, the source-drain region SDR, such as silicon carbon (SiC), is epitaxial-grown by a LPCVD process to form the source and drain of the n-type FinFET (or the NMOSFET). In addition, although the source-drain region SDR is shaped as a rectangle, the disclosure is not limited thereto. In some alternative embodiment, the source-drain region SDR may be shaped as a diamond or any other suitable shape.

Figure 3C:
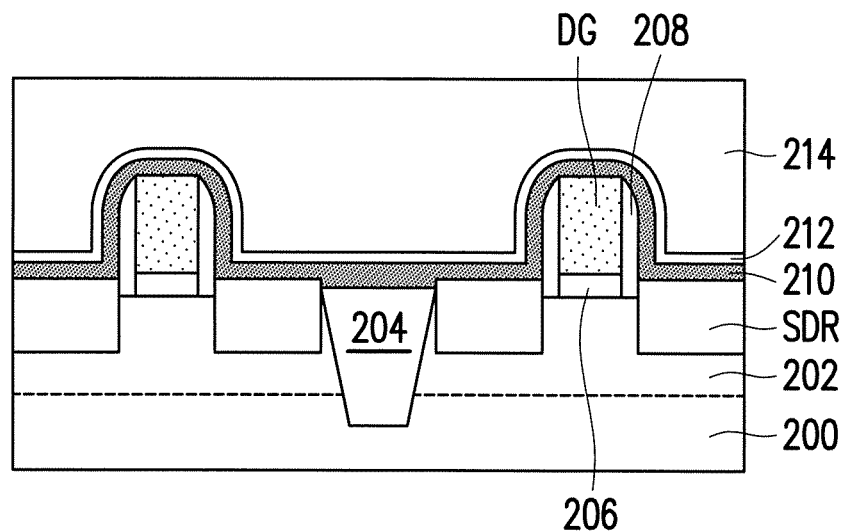

Referring to FIGS. 1 and 3C, at step 130, a contact etch stop layer 210 including SiCON is formed to cover the dummy gate electrode DG and the source-drain region SDR. In some embodiments, after the source-drain region SDR is formed, the contact etch stop layer 210 is conformally formed over the source-drain region SDR and the dummy gate electrode DG. In addition, the contact etch stop layer 210 is extended onto the isolation structure 204 between the fin structures 202 and between the source-drain regions SDR. In other words, the contact etch stop layer 210 is disposed on exposed surfaces of the dummy gate electrode DG, the spacer 208, the source-drain region SDR and the isolation structures 204, such as a top surface of the dummy gate electrode DG, a surface of the spacer 208, a top surface of the source-drain region SDR and a top surface of the isolation structures 204. The contact etch stop layer 210 protects the gate structure from being damaged during contact etching. In some embodiments, the contact etch stop layer 210 is in contact with the spacer 208. In some embodiments, the contact etch stop layer 210 includes silicon carbide oxynitride (SiCON), and is formed using a conformal deposition process such as ALD. In some embodiments, the ALD can be carried out in a ALD furnace at a temperature of about 550° C. to 650° C., using a silicon source compound such as Hexachlorodisilane (HCD) at a pressure of about 66 Pa to 500 Pa and a flow rate of about 1 slm to 0.5 slm, a nitrogen source such as $NH_3$ at a pressure of about 400 Pa to 1200 Pa and a flow rate of about 0.1 slm to 5 slm, $O_2$ at a pressure of about 400 Pa to 1200 Pa and a flow rate of 1 slm to 5 slm and a carbon source compound such as cyclopropane ($C_3H_6$) at a pressure of about 900 Pa to 4600 Pa and a flow rate of 1 slm to 5 slm, for example.

In some embodiments, a thickness of the contact etch stop layer 210 ranges from about 40 angstroms to 80 angstroms, for example.

Then, at step 140, a protection layer 212 is formed over the CESL 210. The protection layer 212 is conformally formed on the contact etch stop layer 210 over the source-drain region SDR and the dummy gate electrode DG. In some embodiments, the protection layer 212 is in contact with the contact etch stop layer 210. In some embodiments, the protection layer 212 includes silicon oxide, silicon nitride, silicon oxynitride, silicon carbon nitride or a combination thereof, and is formed using a suitable process such as ALD or plasma enhanced ALD (PEALD). In some embodiments, the PEALD can be carried out in a PEALD furnace at a temperature of about 200° C. to 300° C. and at a pressure of about 1 Torr to 10 Torr, using precursors including $C_8H_{22}N_2Si$ and plasma $O_2$ under a source power of about 15 W to about 200 W. In some embodiments, a thickness of the protection layer 212 is less than a thickness of the contact etch stop layer 210. For example, a thickness of the protection layer 212 ranges from 10 to 30 angstroms in some embodiments.

At step 150, after the contact etch stop layer 210 and the protection layer 212 are formed, an inter layer dielectric 214 is formed on the protection layer 212 over the contact etch stop layer 210, the source-drain region SDR and the dummy gate electrode DG. In some embodiments, the inter layer dielectric 214 may include silicon oxide, silicon oxynitride, any other suitable insulating material or a combination thereof. In this embodiment, the inter layer dielectric 214 includes flowable oxide, and is formed using flowable chemical vapor deposition (FCVD) to completely fill the gap between the dummy gates DG. In addition, after deposition the flowable oxide, an annealing process such as steam annealing at high temperature may be required to convert the deposited layer to a dense oxide. Generally, low k film is easily oxidized and then nitrogen content is reduced after the annealing process, and thus the low k film fails to prevent the underlying layer being oxidized. However, in some embodiments, the contact etch stop layer 210 is made of low-k material (SiCON) while the protection layer 212 is formed thereon to protect the contact etch stop layer 210 from being oxidized, Accordingly, the contact etch stop layer 210 both has low-k property and provides protection for the source-drain region SDR from being oxidized during the annealing process.

Figure 3D:
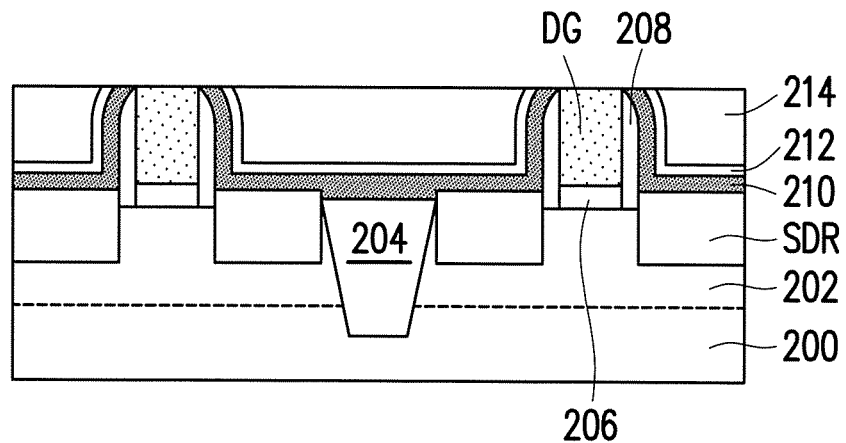

Referring to FIG. 3D, in some embodiments, at step 160, portions of the contact etch stop layer 210, the protection layer 212 and the inter layer dielectric 214 are removed, so as to expose a top portion of the dummy gate electrode DG. In some embodiments, a planarization process is performed to the contact etch stop layer 210, the protection layer 212 and the inter layer dielectric 214, so as to form the structure of FIG. 3D. In some embodiments, after the planarization process is performed, the dummy gate electrode DG has an upper surface substantially coplanar with an upper surface of the contact etch stop layer 210, an upper surface of the protection layer 212 and an upper surface of the inter layer dielectric 214. In some embodiments, the planarization process includes a chemical mechanical polishing (CMP) process, a grinding process, an etching process or another suitable material removal process.

Figure 3E:
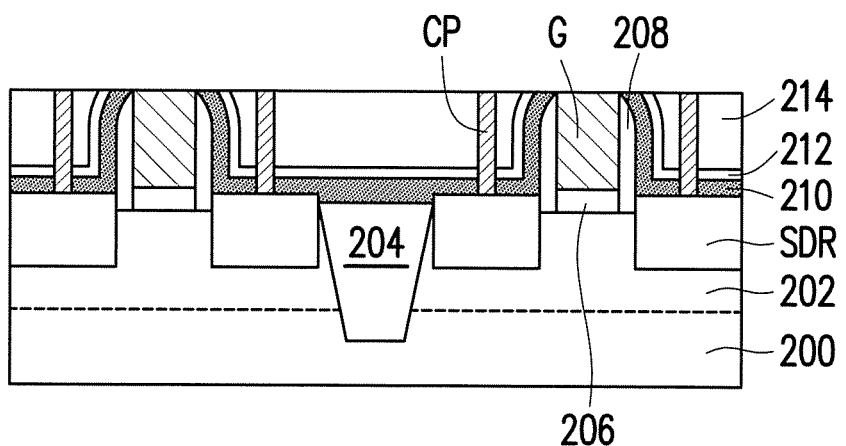

Referring to FIGS. 1 and 3E, at step 170, the dummy gate electrode DG is replaced with a gate electrode G. In some embodiments, the dummy gate electrode DG is removed to form a cavity confined by the spacer 208. In some embodiments, the dummy gate electrode DG is removed using an etching process, such as dry, wet etching process or a combination thereof. In some embodiments, the dummy gate electrode DG is removed using hydrofluoric acid, sulfuric acid, ozone, any other suitable chemical or a combination thereof. In some embodiments, a metal layer may be formed in the cavity by using sputtering, PVD, CVD, atomic layer deposition (ALD), any other suitable formation technique or a combination thereof. Then, a planarization process such as CMP is performed on the metal layer to form the gate electrode G. In some embodiments, the gate electrode G is single-layer structure or multi-layer structure. In some embodiments, the gate electrode G includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the metal layer may include suitable metals, such as TiN, WN, TaN, or Ru that properly perform in the p-type FinFET (or the PMOSFET). In some alternative embodiments, the gate electrode G may include suitable metals, such as Ti, Ag, Al, TiAl, TiAlN, TiAlC, TiAlCN, TaC, TaCN, TaSiN, Mn, or Zr that properly perform in the n-type FinFET (or the NMOSFET). In some alternative embodiments, the gate electrode G may further include barrier layers, work function layers, liner layers, interface layers, seed layers, adhesion layers, etc.

Referring to FIG. 3E, contact plugs CP are formed to electrically connect the source-drain region SDR. In some embodiments, a plurality of contact openings are formed in the inter layer dielectric 214 to expose a portion of the source-drain region SDR, and a conductive material is filled in the contact openings to form the contact plugs CP electrically connected to the source-drain region SDR. The contact openings are formed by an etching process, and the conductive material is formed by a deposition process. The conductive material may include a metal, such as copper, titanium, tungsten, aluminum, any other suitable metal or a combination thereof. In some embodiments, the contact etch stop layer 210 with a low-k material is disposed on the sidewall of the gate electrode G, the inter layer dielectric 214 fills the gaps between the gate electrodes G, and the protection layer 212 is disposed between the contact etch stop layer 210 and inter layer dielectric 214. After forming the contact plug CP, the contact etch stop layer 210 is disposed between the gate electrode G and the contact plug CP.

In some embodiments, since the contact etch stop layer includes a low k material SiCON, the parasitic capacitance formed between the gate electrode and the contact plug can be significantly reduced. More importantly, in some embodiments, during the formation of the inter layer dielectric, the protection layer protects the contact etch stop layer from being oxidized by the annealing process such as steam annealing performed on the inter layer dielectric. Accordingly, the nitrogen and carbon content in the contact etch stop layer may be kept, and the contact etch stop layer can function as a stop layer for etching process and polishing process. In addition, the contact etch stop layer covers the source and drain and protects the source and drain from being oxidized, being over-etched, and moisture penetration. Therefore, the device performance is improved.

In accordance with some embodiments of the disclosure, a field effect transistor includes a gate electrode, a contact etch stop layer (CESL), an inter layer dielectric (ILD) and a protection layer. The CESL includes SiCON and is disposed on a sidewall of the gate electrode. The IDL is laterally adjacent to the gate electrode. The protection layer covers the CESL and is disposed between the CESL and the ILD.

In accordance with alternative embodiments of the disclosure, a field effect transistor includes a fin structure, a gate electrode, a source-drain region, a contact etch stop layer (CESL), an inter layer dielectric (ILD) and a protection layer. The gate electrode crosses over the fin structure. The source-drain region is disposed in the fin structure aside the gate electrode. The CESL includes SiCON, is disposed on a sidewall of the gate electrode and is extended onto the source-drain region. The IDL is laterally adjacent to the gate electrode. The protection layer covers the CESL and is disposed between the CESL and the ILD.

In accordance with yet alternative embodiments of the disclosure, a method of forming a field effect transistor includes the following steps. A dummy gate electrode is formed crossing over a fin structure. A source-drain region is formed aside the dummy gate electrode. A contact etch stop layer (CESL) including SiCON is formed to cover the dummy gate electrode and the source-drain region. A protection layer is formed over the CESL. An inter layer dielectric (ILD) is formed on the protection layer over the dummy gate electrode and the source-drain region. Portions of the CESL, the protection layer and the ILD are removed, so as to expose a top portion of the dummy gate electrode. The dummy gate electrode is replaced with a gate electrode.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A field effect transistor, comprising:
   a gate electrode;
   a contact etch stop layer (CESL) comprising SiCON and disposed on a sidewall of the gate electrode;
   an inter layer dielectric (ILD) laterally adjacent to the gate electrode;
   a protection layer comprising silicon oxide, covering the CESL and disposed between the CESL and the ILD; and
   a contact plug disposed in the ILD and penetrating through the CESL and the protection layer, wherein the contact plug is in direct contact with the CESL, and an entire upper surface of the gate electrode is exposed by the CESL.

2. The field effect transistor of claim 1, wherein the protection layer is in contact with the CESL.

3. The field effect transistor of claim 1 further comprising a spacer on the sidewall of the gate electrode, wherein the CESL is disposed between the spacer and the protection layer.

4. The field effect transistor of claim 1 further comprising a source-drain region aside the gate electrode, wherein the CESL and the protection layer are disposed over the source-drain region.

5. The field effect transistor of claim 1, wherein upper surfaces of the CESL, the protection layer, the gate electrode and the ILD are substantially coplanar.

6. The field effect transistor of claim 1, wherein the entire upper surface of the gate electrode is exposed by the protection layer.

7. A field effect transistor, comprising:
a fin structure;
a gate electrode crossing over the fin structure;
a spacer disposed on a sidewall of the gate electrode;
a source-drain region in the fin structure aside the gate electrode;
a contact etch stop layer (CESL) comprising SiCON, disposed on the spacer and extended onto the source-drain region;
an inter layer dielectric (ILD) laterally adjacent to the gate electrode;
a protection layer, covering the CESL and disposed between the CESL and the ILD, wherein a thickness of the protection layer is less than a thickness of the contact etch stop layer; and
a contact plug disposed in the ILD and penetrating through the CESL and the protection layer to electrically connect the source-drain region, wherein an entire top surface of the gate electrode is substantially coplanar with a topmost surface of the CESL, a topmost surface of the protection layer and a topmost surface of the spacer and the contact plug is in direct contact with the CESL and the protection layer.

8. The field effect transistor of claim 7, wherein a material of the protection layer comprises silicon oxide, silicon nitride, silicon oxynitride, silicon carbon nitride or a combination thereof.

9. The field effect transistor of claim 7, wherein the CESL is disposed between the gate electrode and the contact plug.

10. The field effect transistor of claim 7, wherein an upper surface of the ILD is substantially coplanar with the entire top surface of the gate electrode.

11. The field effect transistor of claim 7, wherein the CESL is in contact with the source-drain region.

12. The field effect transistor of claim 7, wherein the thickness of the protection layer ranges from 10 to 30 angstroms.

13. The field effect transistor of claim 7, wherein the thickness of the contact etch stop layer ranges from 40 to 80 angstroms.

14. A method of fording a field effect transistor, comprising:
forming a dummy gate electrode crossing over a fin structure;
forming a source-drain region aside the dummy gate electrode;
forming a contact etch stop layer (CESL) comprising SiCON to cover the dummy gate electrode and the source-drain region;
forming a protection layer comprising silicon oxide over the CESL;
forming an inter layer dielectric (ILD) of silicon oxide by using flowable chemical vapor deposition on the protection layer over the dummy gate electrode and the source-drain region, wherein the protection layer is disposed between the CESL and the ILD;
removing portions of the CESL, the protection layer and the ILD, so as to expose a top portion of the dummy gate electrode;
replacing the dummy gate electrode with a gate electrode, wherein the remaining CESL is disposed on a sidewall of the gate electrode, and an entire upper surface of the gate electrode is exposed by the CESL; and
forming a contact plug in the ILD, wherein the contact plug penetrates through the CESL and the protection layer to electrically connect the source-drain region, and the contact plug is in direct contact with the CESL.

15. The method of claim 14, wherein a material of the protection layer comprises silicon oxide, silicon nitride, silicon oxynitride, silicon carbon nitride or a combination thereof.

16. The method of claim 15, wherein the CESL is conformally formed on the dummy gate electrode.

17. The method of claim 15, wherein the protection layer is conformally formed on the CESL.

18. The method of claim 15, wherein the CESL is disposed between the gate electrode and the contact plug.

19. The method of claim 14 further comprising performing an annealing process on the ILD.

20. The method of claim 19, wherein forming the annealing process is a steam annealing process.

* * * * *